(12) United States Patent
Jang et al.

(10) Patent No.: US 8,546,837 B2
(45) Date of Patent: *Oct. 1, 2013

(54) LIGHT EMITTING DEVICE HAVING VERTICAL STRUCTURE, PACKAGE THEREOF AND METHOD FOR MANUFACTURING THE SAME

(75) Inventors: Jun Ho Jang, Anyang-si (KR); Geun ho Kim, Seoul (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/080,764

(22) Filed: Apr. 6, 2011

(65) Prior Publication Data
US 2011/0180833 A1    Jul. 28, 2011

Related U.S. Application Data

(63) Continuation of application No. 11/701,535, filed on Feb. 2, 2007, now Pat. No. 7,928,462.

(30) Foreign Application Priority Data

Feb. 16, 2006  (KR) .................. 10-2006-0015039
Feb. 16, 2006  (KR) .................. 10-2006-0015040

(51) Int. Cl.
*H01L 29/22* (2006.01)

(52) U.S. Cl.
USPC ............... 257/99; 257/84; 257/90; 257/106

(58) Field of Classification Search
USPC ........... 257/90, 106, 99, 84, 96, 98, E25.032, 257/E33.061
See application file for complete search history.

(56) References Cited

U.S. PATENT DOCUMENTS

| 3,739,217 A | 6/1973 | Bergh et al. |
| 6,054,716 A | 4/2000 | Sonobe et al. |
| 6,355,497 B1 | 3/2002 | Romano et al. |

(Continued)

FOREIGN PATENT DOCUMENTS

| EP | 1 361 616 A1 | 11/2003 |
| EP | 1526583 | 4/2005 |

(Continued)

OTHER PUBLICATIONS

Amendment filed Jun. 7, 2010, Reply to OA dated Mar. 31, 2010, U.S. Appl. No. 11/701,535.

(Continued)

*Primary Examiner* — Ori Nadav
(74) *Attorney, Agent, or Firm* — McKenna Long & Aldridge LLP

(57) ABSTRACT

A light emitting device having a vertical structure, a package thereof and a method for manufacturing the same, which are capable of damping impact generated in a substrate separation process, and achieving an improvement in mass productivity, are disclosed. The method includes growing a semiconductor layer having a multilayer structure over a substrate, forming a first electrode on the semiconductor layer, separating the substrate including the grown semiconductor layer into unit devices, bonding each of the separated unit devices on a sub-mount, separating the substrate from the semiconductor layer, and forming a second electrode on a surface of the semiconductor layer exposed in accordance with the separation of the substrate.

28 Claims, 17 Drawing Sheets

(56) References Cited

U.S. PATENT DOCUMENTS

| | | |
|---|---|---|
| 6,642,550 B1 | 11/2003 | Whitworth et al. |
| 6,713,877 B2 | 3/2004 | Hirano et al. |
| 7,928,462 B2 * | 4/2011 | Jang et al. ............... 257/99 |
| 2001/0010449 A1 | 8/2001 | Chiu et al. |
| 2002/0123164 A1 | 9/2002 | Slater, Jr. et al. |
| 2003/0189201 A1 | 10/2003 | Chen |
| 2003/0189215 A1 * | 10/2003 | Lee et al. ............... 257/94 |
| 2004/0207310 A1 | 10/2004 | Erchak et al. |
| 2004/0245543 A1 | 12/2004 | Yoo |
| 2004/0259331 A1 | 12/2004 | Ogihara et al. |
| 2005/0072981 A1 | 4/2005 | Suenaga |
| 2005/0093430 A1 | 5/2005 | Ibbetson et al. |
| 2005/0104220 A1 | 5/2005 | Tsuchiya et al. |
| 2005/0121686 A1 * | 6/2005 | Keller et al. ............... 257/99 |
| 2005/0173692 A1 | 8/2005 | Park et al. |
| 2005/0221518 A1 | 10/2005 | Andrews et al. |
| 2005/0227455 A1 | 10/2005 | Park et al. |
| 2005/0236632 A1 | 10/2005 | Lai et al. |
| 2005/0285132 A1 | 12/2005 | Orita |
| 2006/0012053 A1 | 1/2006 | Lai |
| 2006/0198162 A1 | 9/2006 | Ishidu et al. |
| 2006/0270081 A1 | 11/2006 | Chua et al. |

FOREIGN PATENT DOCUMENTS

| | | |
|---|---|---|
| JP | 10-012917 A | 1/1998 |
| JP | 2005-210053 A | 8/2005 |
| JP | 2006-049855 A | 2/2006 |
| KR | 10-2000-0017513 A | 3/2000 |
| KR | 10-2002-0082143 A | 10/2002 |
| KR | 10-2004-0073434 A | 8/2004 |
| KR | 10-2005-00089120 | 9/2005 |
| KR | 10-2005-0093870 A | 9/2005 |
| KR | 2006-0002833 A | 1/2006 |
| KR | 2006-0066619 A | 6/2006 |
| WO | WO 2005/062905 | 7/2005 |
| WO | WO 2005/088743 A1 | 9/2005 |
| WO | WO 2005/104780 A2 | 11/2005 |
| WO | WO 2006/002427 A2 | 1/2006 |

OTHER PUBLICATIONS

Chien-Fu Shen, "Improvement of Brightness and ESD protection ability on GaN blue light emitting Diodes", Institute of Microelectronics & Department of Electrical Engineering National Cheng Kung University Tainan, Taiwan, R.O.C., Thesis for Master of Science, Jun. 2005.

Daniel A. Steigerwald et al., "Illumination With Solid State Lighting Technology", (IEEE Journal on Selected Topics in Quantum Electronics, vol. 8, No. 2, Mar./Apr. 2002.), pp. 310-320.

E. Fred Schubert, 2006, "Light-emitting diodes" Second Edition, pp. 154-155 and 193-195.

Schnitzer et al., "30% external quantum efficiency from surface textured, thin-film light-emitting diodes", Appl. Phys. Lett., vol. 63, No. 16, Oct. 18, 1993, pp. 2174-2176.

Chul Huh et al., "Improved light-output and electrical performance of InGaN-based light-emitting diode by microroughening of the p-GaN surface", Journal of Applied Physics vol. 93, No. 11, Jun. 1, 2003, pp. 9383-9385.

Yan Gao et al., "Roughening Hexagonal Surface Morphology on Laser Lift-Off (LLO) N-face GaN with Simple Photo-Enhanced Chemical Wet Etching", Japanese Journal of Applied Physics vol. 43, No. 5A, 2004, pp. L637-L639.

Hung-Wen Huang et al., "Improvement of InGaN-GaN Light-Emitting Diode Performance With a Nano-Roughened p-GaN Surface", IEEE Photonics Technology Letters, vol. 17, No. 5, May 2005, pp. 983-985.

* cited by examiner

LIGHT EMITTING DEVICE HAVING VERTICAL STRUCTURE, PACKAGE THEREOF AND METHOD FOR MANUFACTURING THE SAME

This application is a continuation of application Ser. No. 11/701,535 filed Feb. 2, 2007 now U.S. Pat. No. 7,928,462, currently allowed, and claims the benefit of Korean Patent Application No. 10-2006-0015039, filed on Feb. 16, 2006 and Korean Patent Application No. 10-2006-0015040, filed on Feb. 16, 2006, which are hereby incorporated by references as if fully set forth herein.

BACKGROUND OF THE INVENTION

1. Field of the Invention

The present invention relates to a light emitting device having a vertical structure, a package thereof and a method for manufacturing the same, and more particularly, to a light emitting device having a vertical structure, a package thereof and a method for manufacturing the same which are capable of damping impact generated in a substrate separation process, and achieving an improvement in mass productivity.

2. Discussion of the Related Art

Light emitting diodes (LEDs) are well known as a semiconductor light emitting device which converts current to light, to emit light. Since a red LED using GaAsP compound semiconductor was commercially available in 1962, it has been used, together with a GaP:N-based green LED, as a light source in electronic apparatuses, for image display.

The wavelength of light emitted from such an LED depends on the semiconductor material used to fabricate the LED. This is because the wavelength of the emitted light depends on the band gap of the semiconductor material representing energy difference between valence-band electrons and conduction-band electrons.

Gallium nitride (GaN) compound semiconductor has been highlighted. One of the reasons why GaN compound semiconductor has been highlighted is that it is possible to fabricate a semiconductor layer capable of emitting green, blue, or white light, using GaN in combination with other elements, for example, indium (In), aluminum (Al), etc.

Thus, it is possible to adjust the wavelength of light to be emitted, using GaN in combination with other appropriate elements. Accordingly, where GaN is used, it is possible to appropriately determine the materials of a desired LED in accordance with the characteristics of the apparatus to which the LED is applied. For example, it is possible to fabricate a blue LED useful for optical recording or a white LED to replace a glow lamp.

On the other hand, initially-developed green LEDs were fabricated using GaP. Since GaP is an indirect transition material causing a degradation in efficiency, the green LEDs fabricated using this material cannot practically produce light of pure green. By virtue of the recent success of growth of an InGaN thin film, however, it has been possible to fabricate a high-luminescent green LED.

By virtue of the above-mentioned advantages and other advantages of GaN-based LEDs, the GaN-based LED market has rapidly grown. Also, techniques associated with GaN-based electro-optic devices have rapidly developed since the GaN-based LEDs became commercially available in 1994.

GaN-based LEDs have been developed to exhibit light emission efficiency superior over that of glow lamps. Currently, the efficiency of GaN-based LEDs is substantially equal to that of fluorescent lamps. Thus, it is expected that the GaN-based LED market will grow significantly.

Despite the rapid advancement in technologies of GaN-based semiconductor devices, the fabrication of GaN-based devices suffers from a great disadvantage of high-production costs. This disadvantage is closely related to difficulties associated with growing of a GaN thin film (epitaxial layer) and subsequent cutting of finished GaN-based devices.

Such a GaN-based device is generally fabricated on a sapphire ($Al_2O_3$) substrate. This is because a sapphire wafer is commercially available in a size suited for the mass production of GaN-based devices, supports GaN epitaxial growth with a relatively high quality, and exhibits a high processability in a wide range of temperatures.

Further, sapphire is chemically and thermally stable, and has a high-melting point enabling implementation of a high-temperature manufacturing process. Also, sapphire has a high bonding energy (122.4 Kcal/mole) and a high dielectric constant. In terms of a chemical structure, the sapphire is a crystalline aluminum oxide ($Al_2O_3$).

Meanwhile, since sapphire is an insulating material, available LED devices manufactured using a sapphire substrate (or other insulating substrates) are practically limited to a lateral or vertical structure.

In the lateral structure, all metal contacts for use in injection of electric current into LEDs are positioned on the top surface of the device structure (or on the same substrate surface). On the other hand, in the vertical structure, one metal contact is positioned on the top surface, and the other contact is positioned on the bottom surface of the device structure after removal of the sapphire (insulating) substrate.

In addition, a flip chip bonding method has also been widely employed. In accordance with the flip chip bonding method, an LED chip, which has been separately prepared, is attached to a sub-mount of, for example, a silicon wafer or ceramic substrate having an excellent thermal conductivity, under the condition in which the LED chip is inverted.

However, the lateral structure or the flip chip method suffers from the problems associated with poor heat release efficiency because the sapphire substrate has a heat conductivity of about 27 W/mK, thus leading to a very high heat resistance. Furthermore, the flip chip method has also disadvantages of requiring large numbers of photolithography process steps, thus resulting in complicated manufacturing processes.

To this end, LED devices having a vertical structure have been highlighted in that the vertical structure involves removal of the sapphire substrate.

In the fabrication of such a vertical LED structure, a laser lift off (LLO) method is used to remove the sapphire substrate, and thus, to solve the problems caused by the sapphire substrate.

However, it is impossible to completely remove the sapphire substrate at once, using the LLO method, due to the size and limited uniformity of a laser beam used in the LLO method. For this reason, uniform small-size laser beams are irradiated to respective portions of the sapphire substrate, in order to the entire portion of the sapphire substrate.

In the LLO method, stress is applied to the GaN thin film upon incidence of a laser beam. In order to separate a sapphire substrate and a GaN thin film from each other, it is necessary to use a laser beam having a high energy density. The laser beam resolves GaN into a metal element, namely, Ga, and nitrogen gas ($N_2$).

The resolved nitrogen gas exhibits a high expansion force, so that it applies considerable impact not only to the GaN thin film 2, but also to a support layer for the GaN thin film 2 and metal layers required for the fabrication of the device. As a result, a degradation in bondability occurs primarily. In addition, a degradation in electrical characteristics occurs.

For example, wave patterns exhibited as having irregularities may be formed at the peripheral portion of the GaN thin film after completion of the LLO process. Also, during the LLO process, many poor bonding portions may be observed on the thin film.

Thus, the nitrogen gas generated during the LLO process damages the semiconductor layer arranged in the vicinity of the nitrogen gas. There may also be a phenomenon that cracks formed at poor-quality portions of the GaN thin film are propagated to other portions of the GaN thin film.

As apparent from the above description, a prolonged process is required in fabricating a desired device using a GaN thin film to form an LED layer. Furthermore, there are many difficulties in implementing this process. In particular, where separation of a substrate is carried out using a laser, nitrogen gas generated due to the laser may easily damage the thin films of a semiconductor layer arranged in the vicinity of the nitrogen gas. As a result, a degradation in productivity may occur.

SUMMARY OF THE INVENTION

Accordingly, the present invention is directed to a light emitting device having a vertical structure, a package thereof and a method for manufacturing the same that substantially obviate one or more problems due to limitations and disadvantages of the related art.

An object of the present invention is to provide a light emitting device having a vertical structure, a package thereof and a method for manufacturing the same which are capable of preventing damage of a semiconductor thin film during a laser lift off process, reducing the number of processes and the processing time, enabling the device to have various arrangement and various shapes.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for manufacturing a package of a light emitting device package having a vertical structure comprises: growing a semiconductor layer having a multilayer structure over a substrate; forming a first electrode on the semiconductor layer; separating the substrate including the grown semiconductor layer into unit devices; bonding each of the separated unit devices on a sub-mount; separating the substrate from the semiconductor layer; and forming a second electrode on a surface of the semiconductor layer exposed in accordance with the separation of the substrate.

In another aspect of the present invention, a package of a light emitting device having a vertical structure comprises: a sub-mount having a light emitting device chip mounting portion formed with at least one pair of electrodes; a light emitting device chip bonded to the sub-mount, the light emitting device chip comprising a support layer electrically connected to one side of each electrode of the sub-mount, a first electrode arranged on the support layer, a semiconductor layer arranged on the first electrode and formed with a light extraction pattern, the semiconductor layer having a multilayer structure, and a second electrode arranged on the semiconductor layer and electrically connected to the other side of each electrode of the sub-mount; and zener diodes formed at the sub-mount such that the zener diodes are connected to respective electrodes of the sub-mount.

In still another aspect of the present invention, a light emitting device having a vertical structure comprises: a support layer made of a metal or semiconductor; an adhesion layer arranged on the support layer, the adhesion layer having a single layer structure or a multilayer structure; a first electrode arranged on the adhesion layer; a semiconductor layer arranged on the first electrode and formed with a light extraction pattern, the semiconductor layer having a multilayer structure; and a second electrode arranged on the semiconductor layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 1 to 18 are sectional view illustrating a first embodiment of the present invention, in which:

FIG. 1 is a sectional view illustrating a process for forming a semiconductor layer;

FIG. 2 is a sectional view illustrating an example of a process for forming a first electrode and a support layer;

FIG. 3 is a sectional view illustrating another example of the process for forming the first electrode and support layer;

FIG. 4 is a sectional view illustrating a laser scribing process;

FIG. 5 is a sectional view illustrating a first example of a light emitting device chip;

FIG. 6 is a sectional view illustrating a mesa etching process carried out after the formation of the semiconductor layer;

FIG. 7 is a sectional view illustrating a process for forming the first electrode and a passivation layer;

FIG. 8 is a sectional view illustrating a process for forming a metal support layer;

FIG. 9 is a sectional view illustrating a second example of the light emitting device chip;

FIG. 10 is a sectional view illustrating a trench etching process carried out after the formation of the semiconductor layer;

FIG. 11 is a sectional view illustrating a third example of the light emitting device chip;

FIG. 12 is a sectional view illustrating an example of bonding of the light emitting device chip to a sub-mount in accordance with the present invention;

FIG. 13 is a schematic view illustrating an example of the sub-mount according to the present invention;

FIG. 14 is a sectional view illustrating a circuit of the sub-mount according to the present invention;

FIG. 15 is a sectional view illustrating a state in which a chip is attached to the sub-mount in accordance with the present invention;

FIG. 16 is a sectional view illustrating a first example of the sub-mount according to the present invention;

FIG. 17 is a sectional view illustrating a second example of the sub-mount according to the present invention;

FIG. 18 is a sectional view illustrating a third example of the sub-mount according to the present invention; FIGS. 20 to 30 are sectional views illustrating a second embodiment of the present invention, in which:

FIG. 20 is a sectional view illustrating a process for forming a semiconductor layer;

FIG. 21 is a sectional view illustrating an example of a process for forming a first electrode;

FIG. 22 is a sectional view illustrating a laser scribing process;

FIG. 23 is a sectional view illustrating a fourth example of a light emitting device chip;

FIG. 24 is a sectional view illustrating a mesa etching process carried out after the formation of the semiconductor layer;

FIG. 25 is a sectional view illustrating a process for forming the first electrode and a passivation layer;

FIG. 26 is a sectional view illustrating a process for forming a metal plate;

FIG. 27 is a sectional view illustrating a fifth example of the light emitting device chip;

FIG. 28 is a sectional view illustrating a trench etching process carried out after the formation of the semiconductor layer;

FIG. 29 is a sectional view illustrating a sixth example of the light emitting device chip; and FIG. 30 is a sectional view illustrating another example of the bonding of the light emitting device chip to the sub-mount in accordance with the present invention.

DETAILED DESCRIPTION OF THE INVENTION

Figure 1:

Reference will now be made in detail to the preferred embodiments of the present invention, examples of which are illustrated in the accompanying drawings.

The present invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

Like numbers refer to like elements throughout the description of the figures. In the drawings, the thickness of layers and regions are exaggerated for clarity.

It will be understood that when an element such as a layer, region or substrate is referred to as being "on" another element, it can be directly on the other element or intervening elements may also be present. It will also be understood that if part of an element, such as a surface, is referred to as "inner," it is farther to the outside of the device than other parts of the element.

In addition, relative terms, such as "beneath" and "overlies", may be used herein to describe one layer's or region's relationship to another layer or region as illustrated in the figures.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

First Embodiment

Hereinafter, a first embodiment of the present invention will be described with reference to the accompanying drawings.

First, a method for manufacturing individual semiconductor light emitting device chips will be described.

As shown in FIG. 1, in order to manufacture a light emitting device chip according to this embodiment, a semiconductor layer 20 having a multilayer structure is formed over a sapphire substrate 10, using a thin film growing method such as a hydride vapor phase epitaxy (HVPE) or a metal organic chemical vapor deposition (MOCVD) method. The HVPE method is advantageous in that it is possible to grow a thin film having a low impurity concentration, namely, a high purity, at a high growth rate of 50 to 100 μm per hour.

The growth of the semiconductor layer 20, which has a multilayer structure, can be achieved by first forming an n type GaN semiconductor layer over the substrate 10, forming an active layer over the n type GaN semiconductor layer, and forming a p type GaN semiconductor layer over the active layer.

Figure 2:
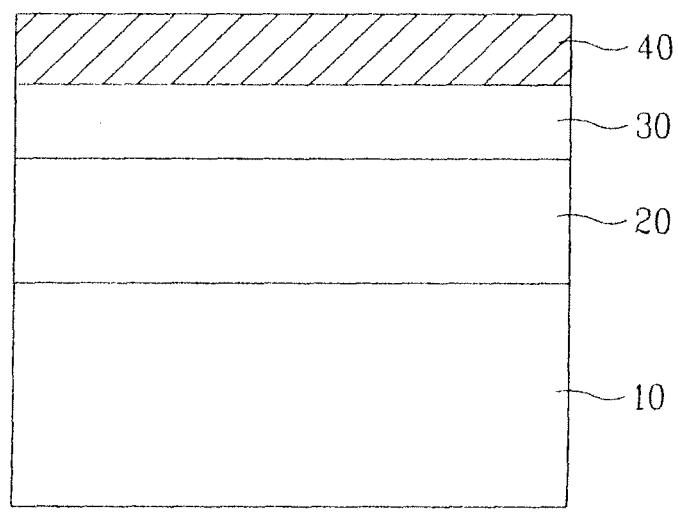

A first electrode 30 is then formed on the semiconductor layer 20, as shown in FIG. 2. The first electrode 30 is a p type electrode or an ohmic electrode. In this case, a transparent electrode may be used for the first electrode 30. The transparent electrode may be made of a transparent conductive oxide such as indium tin oxide (ITO).

A separate support layer 40 may be formed over the first electrode 30, in order to achieve an enhancement in light emission efficiency and an improvement in bonding structure, and to provide a function for protecting or supporting the semiconductor layer 20. The support layer 40 may be made of a metal or a semiconductor containing silicon.

The support layer 40 may include a reflection layer adapted to reflect light emerging from the active layer of the semiconductor layer 20, and thus, to achieve an enhancement in light emission efficiency, and an anti-diffusion layer formed over the reflection layer.

The anti-diffusion layer is also called a "under bump metallization (UBM) layer". Where plating is carried out over a reflection electrode, or a metal support layer is attached to the reflection electrode, a solder is mainly used. In this case, the solder may be diffused into the semiconductor layer 20 in a melted state, so that it may adversely affect light emission characteristics. The anti-diffusion layer functions to avoid such a phenomenon.

In order to enable a chip to be bonded to a sub-mount, which will be described later, a plate made of a metal such as Cu, Ni, or Au may be subsequently formed on the anti-diffusion layer. For the same purpose, a semiconductor wafer or substrate made of, for example, Si, may be attached to the anti-diffusion layer.

Figure 3:
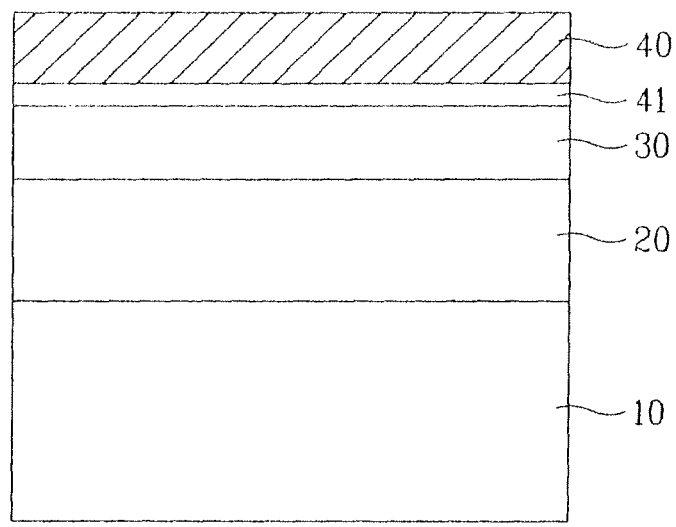

On the other hand, after the formation of the first electrode 30 over the semiconductor layer 20 formed over the substrate 10, an adhesion layer 41 having a single layer structure or a multilayer structure may be formed over the first electrode 30, for formation of the support layer 40, as shown in FIG. 3.

In this case, the first electrode 30 may include a reflection film, or may be made of a material having a high reflectivity, to function as a reflection electrode.

The adhesion layer 41 arranged on the first electrode 30 is a metal layer for bonding the support layer 40 to the first electrode 30. The adhesion layer 41 may have a single layer structure or a multilayer structure including two or more layers.

The adhesion layer 41 may have a thickness corresponding to 2 to 10 times the thickness of the first electrode 30, in order to provide a sufficient bonding strength.

The support layer 40 is bonded to the adhesion layer 41. The support layer 40 may be made of a semiconductor wafer or substrate containing Si.

For the support layer 40, a metal plate may be used. The metal plate may be formed over the adhesion layer 41 in accordance with a plating process.

Figure 4:
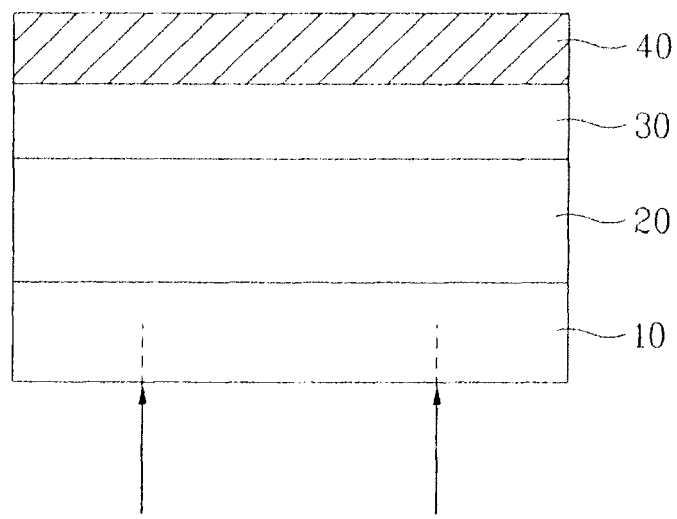
Figure 5:
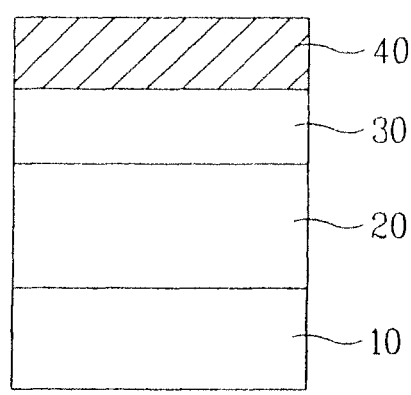

Thereafter, a process for separating the chip structure fabricated as described above into individual unit device chips is carried out. As shown in FIG. 4, the substrate 10 is first thinned. Scribing is then carried out using a laser, to define regions corresponding to respective unit device chips. Thereafter, a cutting force is applied to the scribed portions of the chip structure in accordance with a mechanical method, thereby causing the chip structure to be separated into individual chips 100.

Figure 6:
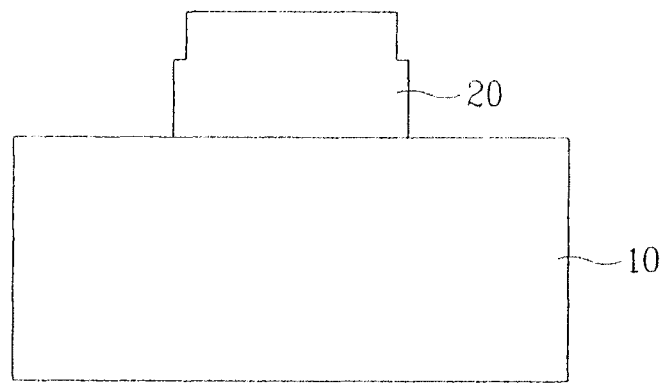

On the other hand, in accordance with another method for manufacturing individual light emitting device chips, individual device chips may be fabricated using a mesa etching process carried out after the growth of the semiconductor layer 20 which has a multilayer structure, as shown in FIG. 6.

In the mesa etching process, the semiconductor layer 20 grown over the substrate 10 is etched until the n type semiconductor layer is exposed in each device chip region.

Figure 7:
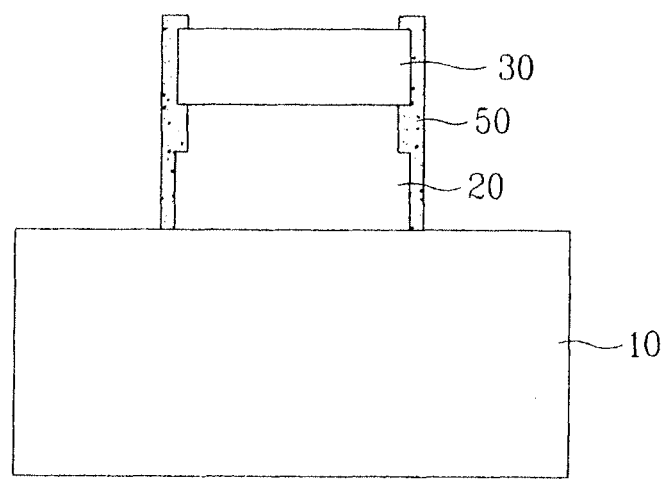

In this case, as shown in FIG. 7, a first electrode 30 is then formed. Subsequently, a passivation layer 50 is formed to protect the first electrode 30 and surfaces exposed in accordance with the etching process.

Figure 8:
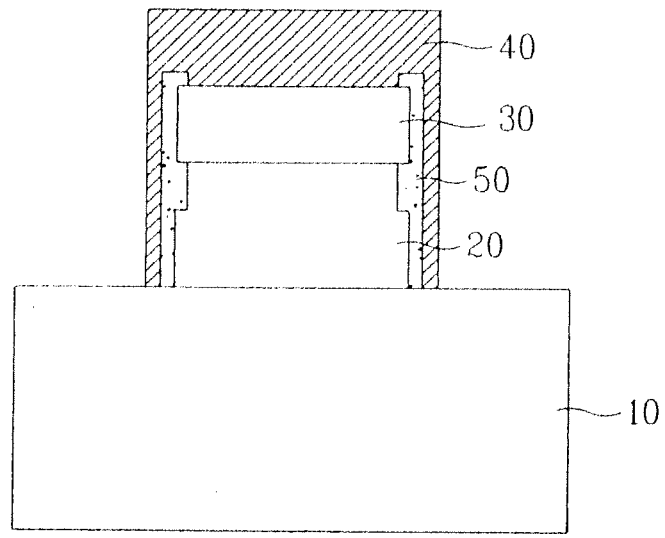

Thereafter, a support layer 40 is formed, as shown in FIG. 8. The support layer 40 may include a reflection electrode, an anti-diffusion layer, and a metal plate made of a metal such as Cu, Ni, or Au.

Figure 9:
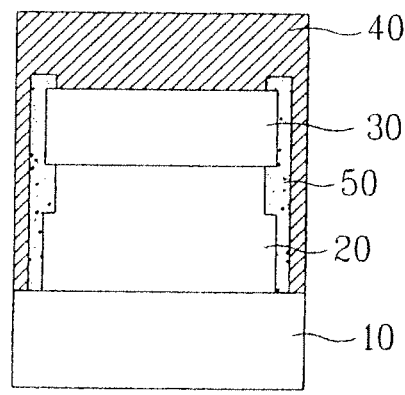

Subsequently, a process for thinning the substrate 10, performing laser scribing, and separating chips is carried out in the same manner as described above. Each separated chip 100 has a structure as shown in FIG. 9.

Figure 10:
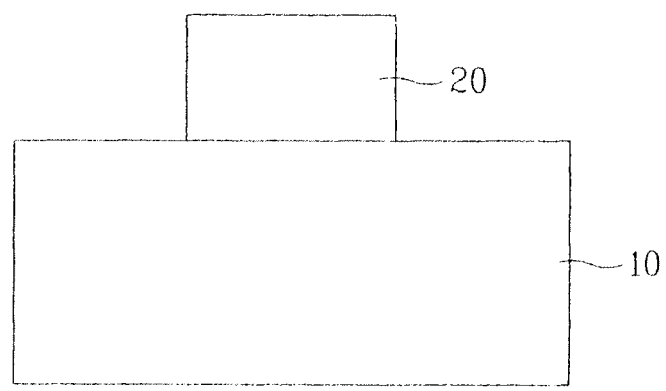

Alternatively, device chips may be fabricated by performing, in place of the mesa etching process, a trench etching process in which the semiconductor layer 20 is etched until the substrate 10 is exposed, as shown in FIG. 10.

Figure 11:
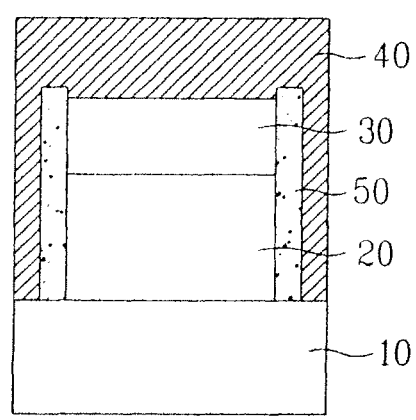

The remaining processes are identical to those in the above-described case. Each chip 100, which is finally obtained, has a structure as shown in FIG. 11.

Figure 12:
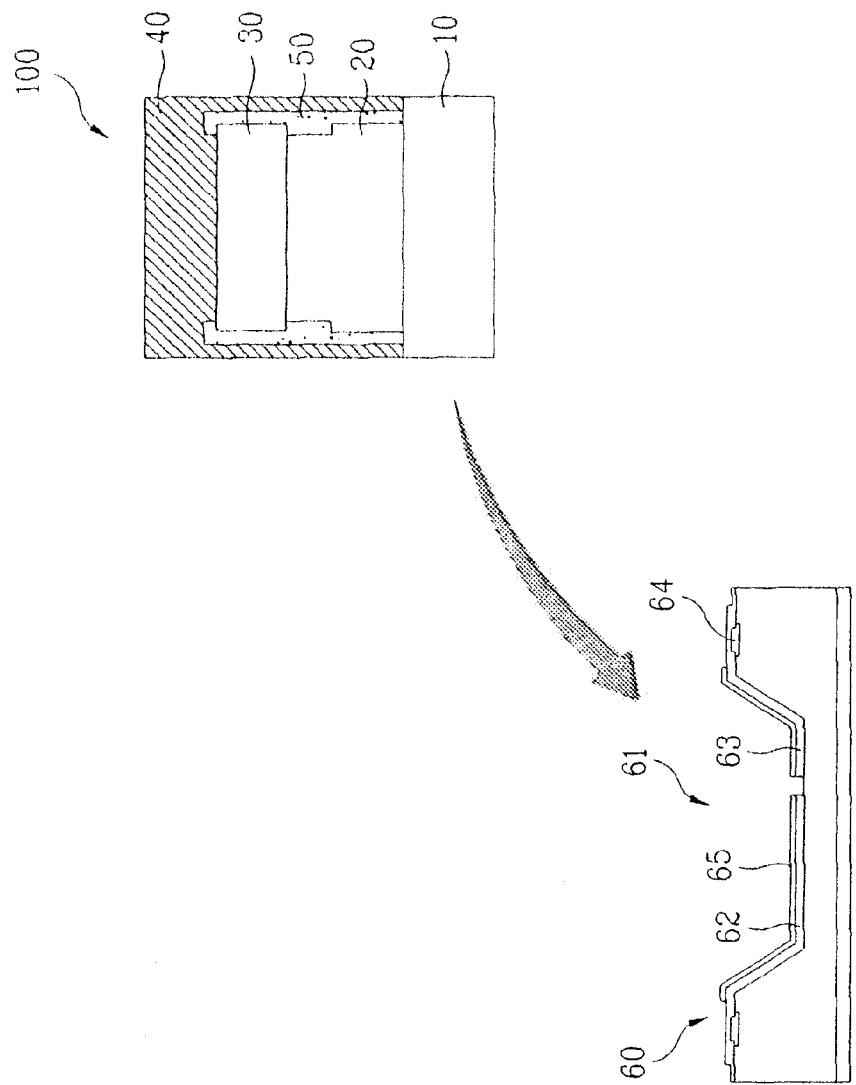

As shown in FIG. 12, each chip 100 is bonded to a sub-mount 60 which is separately prepared. The bonding of the chip 100 is carried out such that the first electrode 30 or support layer 40 of the chip 100 is attached to a mounting portion 61 of the sub-mount 60. The first electrode 30 or support layer 40 is electrically connected to electrodes 62 and 63 formed at the mounting portion 61 of the sub-mount 60.

A reflection plate 65 may be formed on a portion of each of the electrodes 62 and 63.

For the sub-mount 60, a substrate made of Si, AlN ceramic, $AlO_x$, $Al_2O_3$, or BeO, or a PCB substrate may be used. Zener diodes 64 may be formed at the sub-mount 60, to achieve an improvement in electrostatic discharge (ESD) property.

When static electricity is generated in a device, a high voltage may be applied to the device. In this case, an electrostatic breakdown occurs, so that the characteristics of the device disappear. This phenomenon is called an "ESD phenomenon". Such an ESD phenomenon occurs frequently in a procedure of assembling or handling the device in a manual manner or using equipment. Accordingly, it is important to enhance the characteristics of the device by optimizing the structure of the device for eliminating an internal current concentration phenomenon, and thus, achieving an improvement in ESD property (namely, an increase in the electrostatic resistance of the device at a higher voltage).

In detail, such static electricity may be generated during a process for manufacturing a semiconductor, or during a process for mounting the manufactured semiconductor on a PCB.

Static electricity is not always generated. Furthermore, although static electricity is generated, its quantity (voltage and current) is not constant. For this reason, for a quantitative test for static electricity, it is necessary to produce static electricity having constant voltage and current waveforms. For an international standard (for complete products) for standardized static electricity, there is IEC 61000-4-2, EIAJ, MIL STD, -883D, E (3015). The representative standard in Korea is KN61000-4-4 (Korean version of IEC61000-4-2).

The bonding of the chip 100 to the sub-mount 60 may be achieved using the following method.

In accordance with one method, the unit device chip 100 is mounted on the sub-mount 60 using an adhesive. Thereafter, a pressure is thermally applied to the unit device chip 100, thereby bonding the unit device chip 100 to the sub-mount 60.

In accordance with another method, the unit device chip 100 is aligned with the sub-mount 60, and is mounted on (brought into contact with) the sub-mount 60. Thereafter, bonding is carried out using a frictional heat generated in accordance with ultrasonic vibrations.

In the latter case, the metal plate for the support layer 40 of the chip 100 may be made of Au, and Au balls may be arranged on an area facing the chip 100. When ultrasonic (U/S) bonding is carried out, it is possible to improve bonding characteristics, in particular, thermal characteristics.

Figure 13:
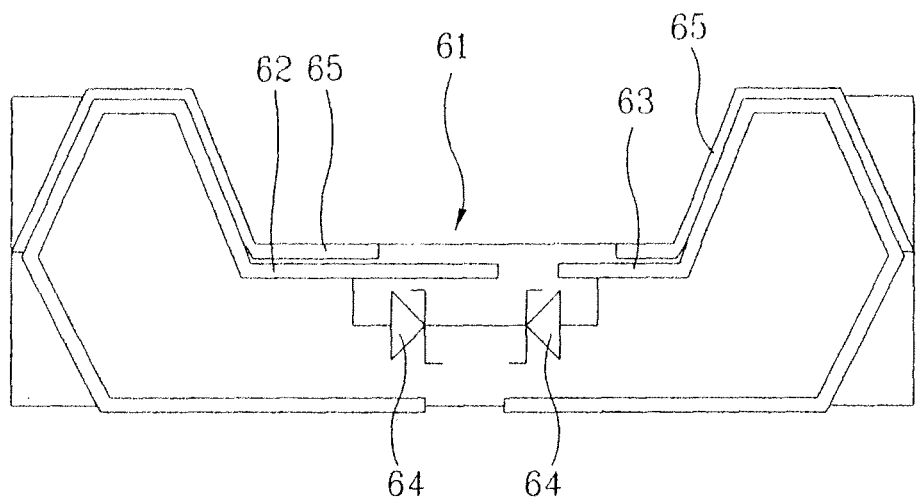

FIG. 13 illustrates an example of a 3D through hole interconnection (THI) sub-mount provided with zener diodes 64 to achieve an improvement in ESD property.

As shown in FIG. 13, the sub-mount 60 includes a mount portion 61 to which a light emitting device chip is bonded. A pair of electrodes 62 and 63 are formed at the mounting portion 61. The electrode 62 is a positive electrode to come into contact with the first electrode 30 or support layer 40 of the chip 100, whereas the electrode 63 is a negative electrode to come into contact with a second electrode 70 of the chip 100 which will be described later. Of course, the electrodes 62 and 63 may be arranged at positions opposite to those of the above-described case. Also, the objects, to which the electrodes 62 and 63 are to be bonded, may be changed.

Figure 14:
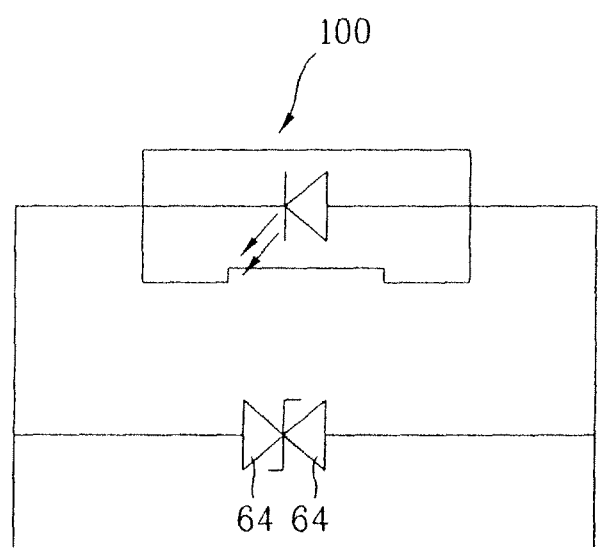

When the zener diodes 64 are coupled to the chip 100 in such a manner that they are coupled to the electrodes 62 and 63 in opposite directions, to exhibit opposite polarities, respectively, a circuit shown in FIG. 14 is established.

That is, in the circuit of FIG. 14, the zener diodes 64 are connected to the chip 100 in parallel in such a manner that the zener diodes 64 are connected to the electrodes 62 and 63 connected to the chip 100 in opposite directions, to exhibit opposite polarities, respectively. When an excessive voltage higher than a breakdown voltage of the zener diodes 64 is applied to the chip 100 in the circuit of FIG. 14, current flows through the zener diodes 64.

As described above, it may be possible to reflect light emitted from the chip 100, using the reflection plate 65 which is separately provided at the mount portion 61 of the sub-mount 60, as described above.

Figure 15:
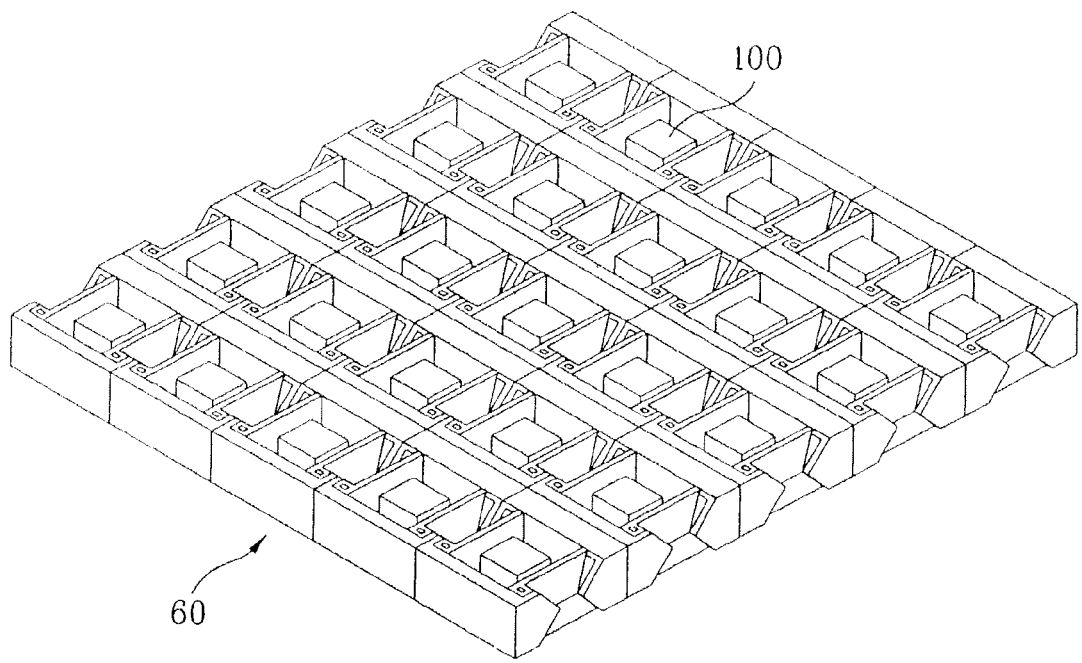

FIG. 15 illustrates light emitting device chips 100 respectively attached to a plurality of sub-mounts 60. The sub-mounts 60 are connected to one another, and form a planar structure. Chips 100 are then attached to the connected sub-mounts 60. Thus, a light emitting device package structure is completely fabricated. The light emitting device package structure is finally separated into individual packages which will be used.

After completion of the bonding of the chip 100 to the sub-mount 60, the substrate 10 is separated from the semiconductor layer 20 by irradiating a laser to the bonded structure at the side of the substrate 10.

That is, an eximer laser is irradiated to the substrate 10. The laser beam passes through the substrate 10, and locally generates heat at the interface between the substrate (sapphire substrate) 10 and the semiconductor layer 20. The generated heat resolves GaN into Ga and $N_2$ gas at the interface between the sapphire substrate 10 and the GaN layer of the semiconductor layer 20. As a result, the sapphire substrate 10 is separated from the semiconductor layer 20. This process is called a "laser lift off process".

Since the separation of the substrate 10 is carried out under the condition in which each chip 100 has been separated from the package structure, but has been still attached to the associated sub-mount 60, it is possible to reduce the processing time and to maintain a superior thin film quality, as compared to the case in which the laser lift off process is carried out under the condition in which the chip 100 has not been separated from the package structure.

This is because, although $N_2$ gas generated during the laser irradiation is spread toward the semiconductor layer 20, thereby damaging the semiconductor layer 20, in the latter case, such $N_2$ gas can be discharged out of the chip 100 at the boundary surfaces of the chip 100 under the condition in which the chip 100 has been separated from the package structure, but has been still attached to the sub-mount 60, as in the former case.

Figure 16:
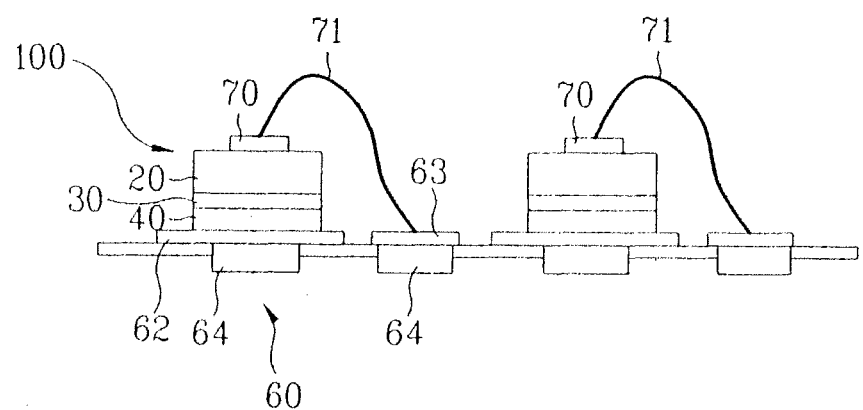
Figure 17:
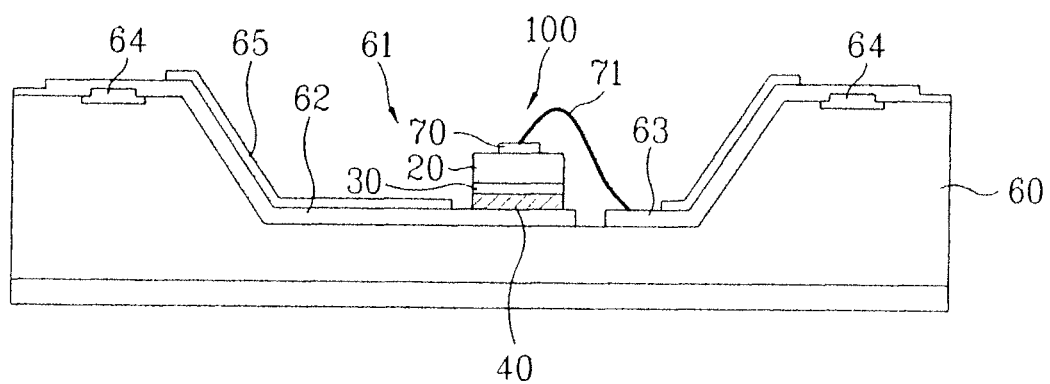
Figure 18:
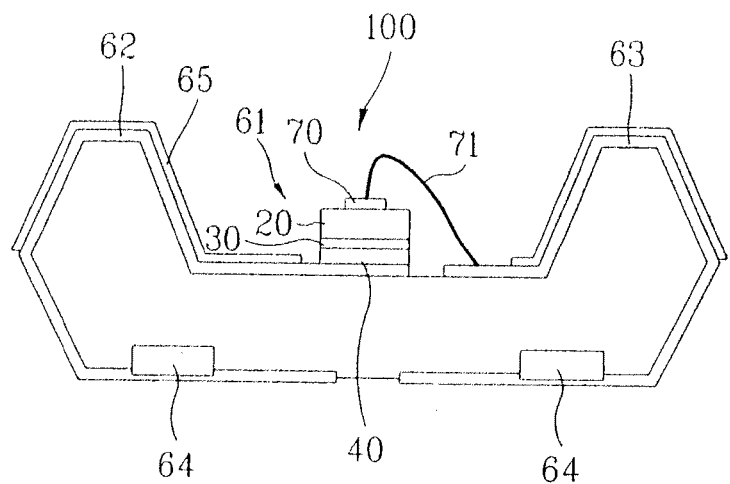
Figure 19:
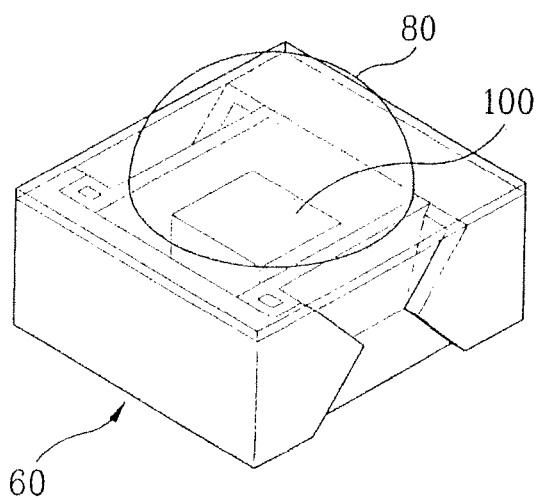
FIG. 19 is a perspective view illustrating a light emitting device package manufactured in accordance with the present invention.

After the separation of the substrate 10, a second electrode 70 is formed at a surface of the semiconductor layer 20 exposed in accordance with the separation of the substrate 10, as shown in FIGS. 16 to 18. A wire bonding process is then carried out to connect the second electrode 70 to the negative electrode 63 formed on the sub-mount 60 by a wire 71.

In this case, the second electrode 70 may be an n type electrode.

For the sub-mount 60, a planar sub-mount as shown in FIG. 16, a 3D sub-mount as shown in FIG. 17, or a 3D THI sub-mount as shown in FIG. 18 may be used.

In the case using a planar sub-mount 60 shown in FIG. 16, the light emitting device chip 100 is bonded to electrodes 62 and 63 formed on an upper surface of the planar sub-mount 60. Zener diodes 64 may be formed beneath the electrodes 62 and 63, respectively.

In the case using a 3D sub-mount shown in FIG. 17, the light emitting device chip 100 is bonded to the sub-mount 60, using a structure as shown in FIG. 12.

On the other hand, in the case using a 3D THI sub-mount shown in FIG. 18, a through hole is formed between adjacent sub-mounts. A positive electrode 62 and a negative electrode 63 are then formed to extend along upper and lower surfaces of each sub-mount through the through hole. Zener diodes 64 are formed on the portions of the electrodes 62 and 63 arranged on the lower surface of each sub-mount.

In order to achieve an enhancement in the light emission efficiency of the chip 100, a light extraction pattern, which may have various shapes, may be formed on a light emission surface of the chip 100.

The pattern formation may be achieved using various methods. One method is a method using a patterned sapphire substrate (PSS). In accordance with this method, a patterned structure is formed on a sapphire substrate, in order to grow thin films for fabrication of a desired device.

When the sapphire substrate 10 is separated after the fabrication of the device as described, an irregularity pattern enabling light to be effectively emitted is naturally formed at the light emission surface.

In addition, it is possible to form a micro pattern on the light emission surface, using attachment of PBC (photonic crystals) or nano particles, or nano imprint.

Meanwhile, a white light emitting device may be fabricated by coating phosphors, such as yellow phosphors, over the outer surface of the chip 100 after completion of the fabrication of the device.

In this case, blue light emitted from the GaN-based light emitting device is emitted after being partially absorbed by the yellow phosphors, so that white light is emitted.

The coating of yellow phosphors may be achieved using various methods, for example, a dispensing method, a screen printing method, or a molding method for an epoxy resin mixed with yellow phosphors.

Thereafter, a filler is formed on the sub-mount 60. A lens 80 is then bonded to the sub-mount 60 over the chip 100. The resulting structure, which has been obtained after completion of the above-described processes carried out for a plurality of sub-mounts 60, is separated into individual devices. Thus, packaging of light emitting devices is completed.

Second Embodiment

Hereinafter, a second embodiment of the present invention will be described with reference to FIGS. 20 to 30. No description may be given of the processes of the second embodiment identical to those of the first embodiment.

First, a method for manufacturing individual semiconductor light emitting device chips will be described.

Figure 20:
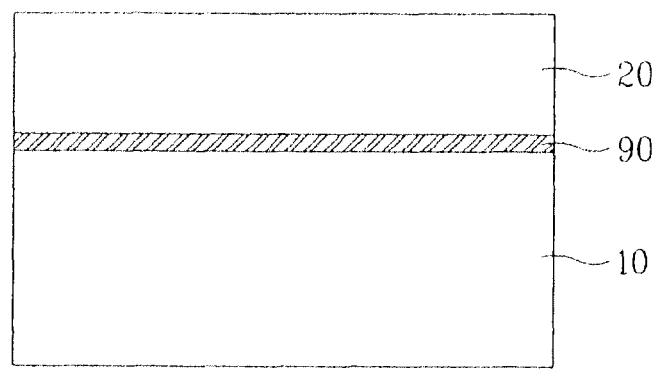

As shown in FIG. 20, in order to manufacture a light emitting device chip according to this embodiment, a semiconductor layer 20 having a multilayer structure is formed over a sapphire substrate 10, using a thin film growing method such as a hydride vapor phase epitaxy (HVPE) or a metal organic chemical vapor deposition (MOCVD) method, after formation of a metal buffer layer 90 over the sapphire substrate 10.

The growth of the semiconductor layer 20, which has a multilayer structure, can be achieved by first forming an n type GaN semiconductor layer over the substrate 10, forming an active layer over the n type GaN semiconductor layer, and forming a p type GaN semiconductor layer over the active layer.

Figure 21:
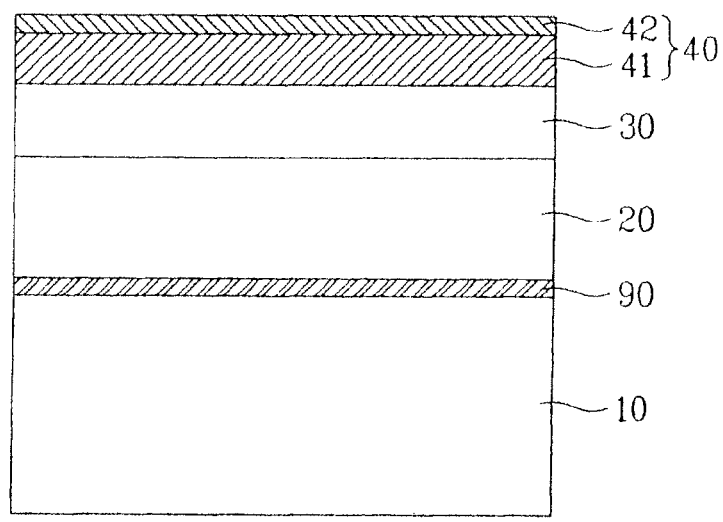

A first electrode 30 is then formed on the semiconductor layer 20, as shown in FIG. 21. The first electrode 30 is a p type electrode or an ohmic electrode, and has a reflection electrode function. Accordingly, the first electrode 30 can achieve an enhancement in light emission efficiency as it reflects light emitted from the active layer of the semiconductor layer 20. The first electrode 30 may be made of indium tin oxide (ITO).

A separate support layer 40 may be formed over the first electrode 30. The support layer 40 may include an anti-diffusion layer 41. Where plating is carried out over the first electrode 30, or the support layer 40 is attached to the first electrode 30, a solder, which may be mainly used in this case, may penetrate into the semiconductor layer 20 in a melted state, so that it may adversely affect light emission characteristics. The anti-diffusion layer 41 functions to avoid such a phenomenon.

In order to enable a chip to be bonded to a sub-mount, which will be described later, a plate 42 made of a metal such as Cu, Ni, or Au may be subsequently formed on the anti-diffusion layer 41. For the same purpose, a semiconductor substrate made of, for example, Si, may be attached to the anti-diffusion layer 41.

Figure 22:
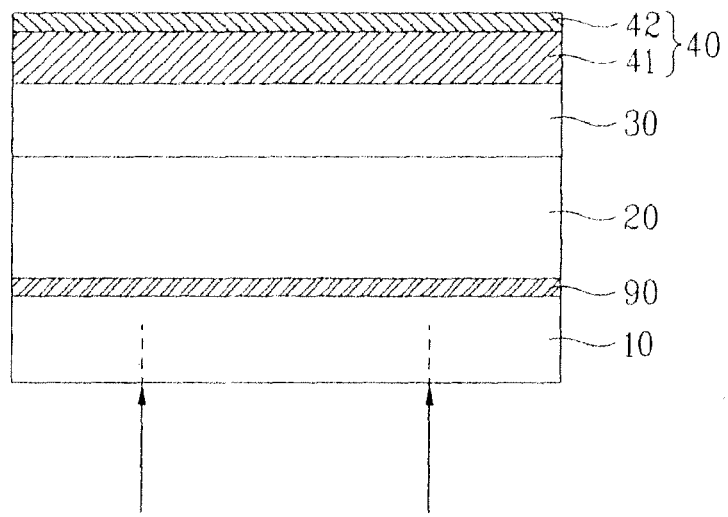
Figure 23:
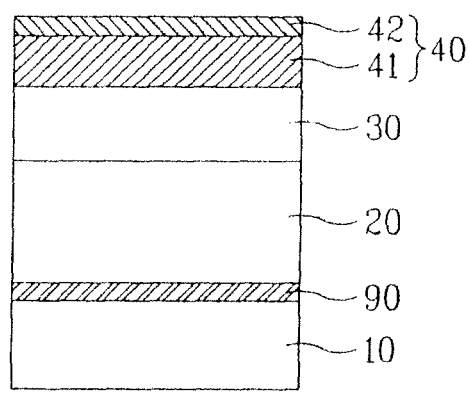

Thereafter, a process for separating the chip structure fabricated as described above into individual unit device chips is carried out. As shown in FIG. 22, the substrate 10 is first thinned. Scribing is then carried out using a laser, to define regions corresponding to respective unit device chips. Thereafter, a cutting force is applied to the scribed portions of the chip structure in accordance with a mechanical method, thereby causing the chip structure to be separated into individual chips 100.

Figure 24:
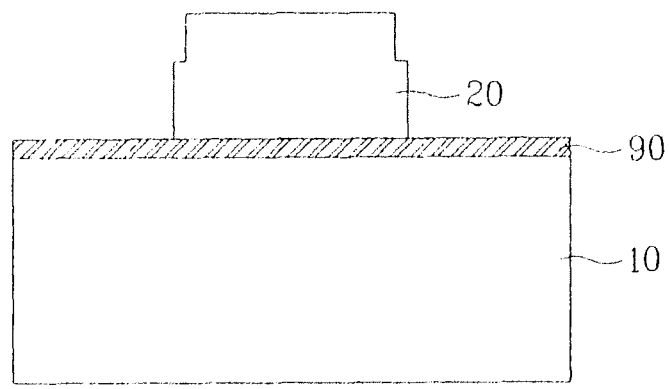

On the other hand, in accordance with another method for manufacturing individual light emitting device chips, individual device chips may be fabricated using a mesa etching process carried out after the growth of the semiconductor layer 20 which has a multilayer structure, as shown in FIG. 24.

In the mesa etching process, the semiconductor layer 20 grown over the substrate 10 is etched until the n type semiconductor layer is exposed in each device chip region.

Figure 25:
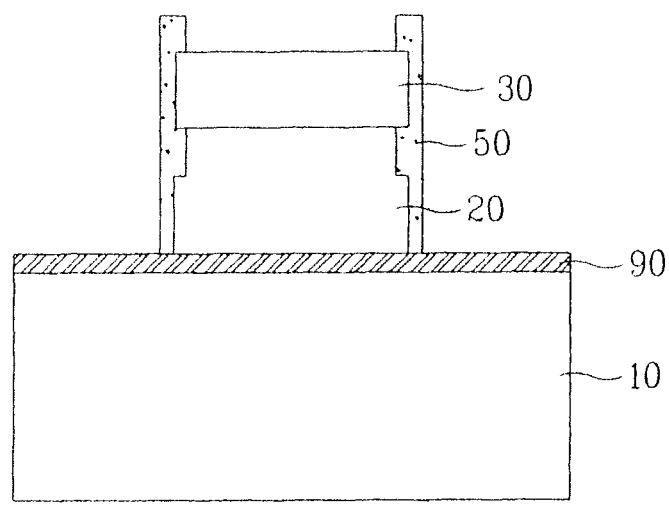
Figure 26:
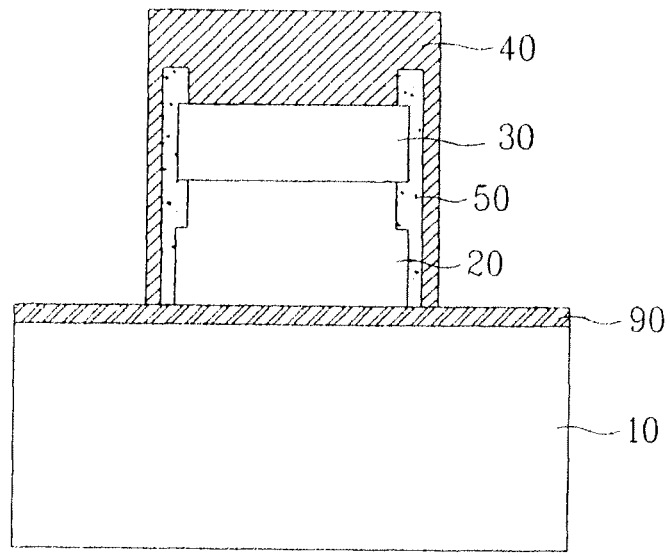

In this case, as shown in FIG. 25, a first electrode 30 is then formed. Subsequently, a passivation layer 50 is formed to protect the first electrode 30 and surfaces exposed in accordance with the etching process. Thereafter, a support layer 40 is formed, as shown in FIG. 26. The support layer 40 may include a metal plate made of a metal such as Cu, Ni, or Au.

Figure 27:
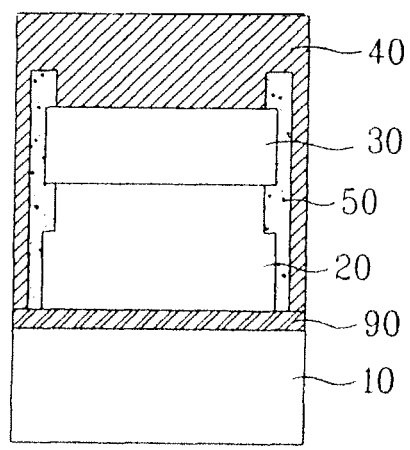

Subsequently, a process for thinning the substrate 10, performing laser scribing, and separating chips is carried out in the same manner as described above. Each separated chip 100 has a structure as shown in FIG. 27.

Figure 28:
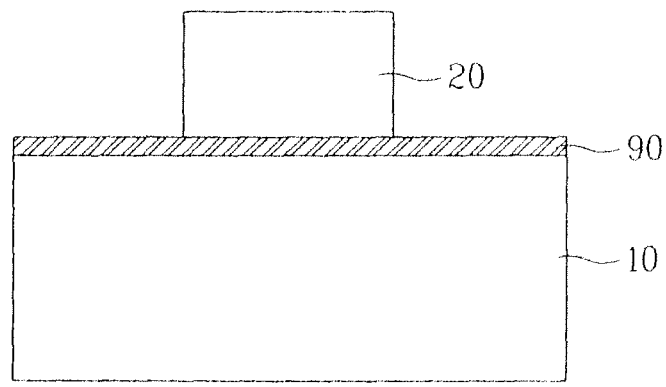

Alternatively, device chips may be fabricated by performing, in place of the mesa etching process, a trench etching process in which the semiconductor layer 20 is etched until the substrate 10 is exposed, as shown in FIG. 28.

Figure 29:
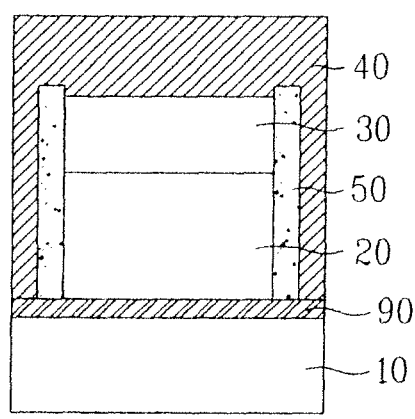

The remaining processes are identical to those in the above-described case. Each chip 100, which is finally obtained, has a structure as shown in FIG. 29.

Figure 30:
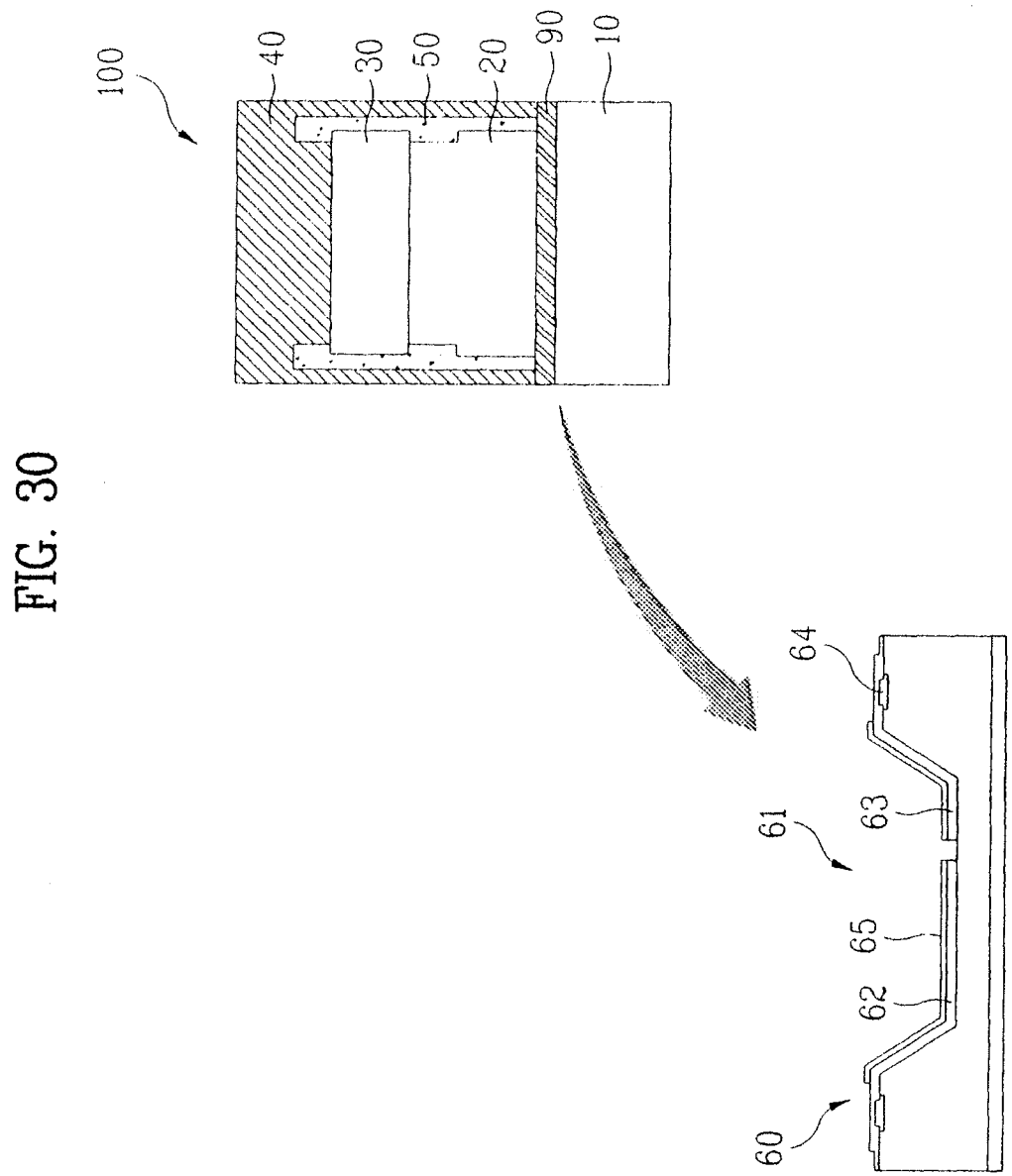

As shown in FIG. 30, each chip 100 is bonded to a sub-mount 60 which is separately fabricated. The bonding of the chip 100 is carried out such that the first electrode 30 of the chip 100 is attached to electrodes 62 and 63 formed on a mounting portion 61 of the sub-mount 60.

For the sub-mount 60, a substrate made of Si, AlN ceramic, $AlO_x$, $Al_2O_3$, or BeO, or a PCB substrate may be used. Zener diodes 64 may be formed at the sub-mount 60, to achieve an improvement in electrostatic discharge (ESD) property. Also, a reflection plate 65 may be formed to achieve an enhancement in light emission efficiency.

After completion of the bonding of the chip 100 to the sub-mount 60, the substrate 10 is separated from the semiconductor layer 20 by etching the metal buffer layer 90 of the chip 100.

Thereafter, a second electrode is formed at a surface exposed in accordance with the separation of the substrate 10. A packaging process involving a wire bonding process is then carried out. This process is identical to that of the first embodiment.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device package comprising:
a sub-mount having a first surface and a second surface, the first surface includes a first portion and a second portion;
a first-type electrode and a second-type electrode on the first surface of the sub-mount;
a light emitting device on the first portion, the light emitting device comprising a supporting layer including an anti-diffusion layer, a first electrode on the supporting layer, a semiconductor layer electrically connected to the first electrode, and a second electrode electrically connected to the semiconductor layer, wherein the first electrode is electrically connected to the first-type electrode and the second electrode is electrically connected to the second-type electrode, and wherein the light emitting device comprises a light extraction structure;
a zener diode on the second portion of the sub-mount such that the zener diode is electrically connected to the first-type electrode and the second-type electrode, wherein the light emitting device and the zener diode are disposed on the first surface of the sub-mount, and wherein the zener diode is arranged a distance apart from the light emitting device; and
a lens on the sub-mount, the lens is disposed over the light emitting device.

2. The package according to claim 1, wherein the supporting layer is arranged between the first electrode and the first-type electrode.

3. The package according to claim 1, wherein the supporting layer comprises a metal plate.

4. The package according to claim 3, wherein the metal plate comprises at least one of Cu, Ni, and Au, or an alloy thereof.

5. The package according to claim 1, wherein the supporting layer comprises a metal or a semiconductor.

6. The package according to claim 5, wherein the semiconductor comprises Si.

7. The package according to claim 1, wherein the support layer comprises a reflection layer.

8. The package according to claim 1, further comprising an adhesion layer between the semiconductor layer and the supporting layer.

9. The package according to claim 8, wherein the adhesion layer has a double-layer structure.

10. The package according to claim 8, wherein the adhesion layer has a thickness corresponding to 2 to 10 times the thickness of the first electrode.

11. The package according to claim 1, wherein the light extraction structure comprises at least one of an irregularity pattern, a photonic crystal, or a plurality of nano particles.

12. The package according to claim 1, wherein the light extraction structure is an integral part of the semiconductor layer.

13. The package according to claim 1, wherein the light extraction structure is arranged at a light emission surface of the light emitting device.

14. The package according to claim 1, further comprising a passivation layer arranged on the semiconductor layer.

15. The package according to claim 1, wherein the first electrode comprises at least two metals, or has a multilayer structure of at least two metal layers alternately arranged.

16. The package according to claim 1, wherein the first electrode comprises an ohmic contact and a reflection electrode.

17. The package according to claim 1, wherein the sub-mount comprises at least one of Si, AlN, ceramic, $AlO_x$, $Al_2O_3$, or BeO, or a PCB.

18. The package according to claim 1, wherein the sub-mount comprises one of a planar sub-mount, a 3D sub-mount, and a 3D through hole interconnection (THI) sub-mount.

19. The package according to claim 1, further comprising a reflection plate on the sub-mount portion.

20. The package according to claim 1, further comprising a filler on the sub-mount portion.

21. The package according to claim 1, further comprising a wavelength converting layer on the light emitting device.

22. The package according to claim 21, wherein the wavelength converting layer comprises a yellow phosphor material.

23. The package according to claim 21, wherein the wavelength converting layer comprises a resin mixed with a phosphor.

24. The package according to claim 1, wherein the first surface further comprises a third portion, and the lens is disposed on the third portion.

25. The package according to claim 1, wherein the first surface and the second surface are disposed on an opposite direction of the sub-mount.

26. The package according to claim 1, wherein a height of the first portion is different from a height of the second portion.

27. A light emitting device package comprising:
a sub-mount having a first surface and a second surface;
a first-type electrode and a second-type electrode on the first surface;
a light emitting device on the first surface, the light emitting device comprising a light extraction structure;
a zener diode on the first surface, the zener diode is electrically connected to the light emitting device, wherein the light emitting device and the zener diode are disposed at different heights from the first surface, and wherein the zener diode is arranged a distance apart from the light emitting device; and
a lens on the sub-mount, the lens is disposed over the light emitting device,
wherein the light emitting device comprises a supporting layer including an anti-diffusion layer, a first electrode on the supporting layer, a semiconductor layer electrically connected to the first electrode, and a second electrode electrically connected to the semiconductor layer, wherein the first electrode is electrically connected to the first-type electrode and the second electrode is electrically connected to the second-type electrode.

28. The package according to claim 27, wherein the zener diode is electrically connected to the first-type electrode and the second-type electrode.

* * * * *